(12) United States Patent
Mitsui et al.

(10) Patent No.: US 7,026,077 B2
(45) Date of Patent: Apr. 11, 2006

(54) PHOTOMASK BLANK MANUFACTURING METHOD

(75) Inventors: Masaru Mitsui, Yamanashi (JP); Toshiyuki Suzuki, Yamanashi (JP); Shigenori Ishihara, Yamanashi (JP)

(73) Assignee: Hoya Corporation, Tokyo (JP)

( * ) Notice: Subject to any disclaimer, the term of this patent is extended or adjusted under 35 U.S.C. 154(b) by 77 days.

(21) Appl. No.: 10/420,005

(22) Filed: Apr. 22, 2003

(65) Prior Publication Data

US 2003/0228528 A1 Dec. 11, 2003

(30) Foreign Application Priority Data

Apr. 22, 2002 (JP) ............... P. 2002-118944

(51) Int. Cl.
*G03F 1/00* (2006.01)
(52) U.S. Cl. .................................. 430/5
(58) Field of Classification Search .......... 430/5
See application file for complete search history.

(56) References Cited

U.S. PATENT DOCUMENTS

| 5,538,816 A | * | 7/1996 | Hashimoto et al. | 430/5 |
| 6,677,087 B1 | * | 1/2004 | Nozawa et al. | 430/5 |
| 6,723,477 B1 | * | 4/2004 | Nozawa et al. | 430/5 |

FOREIGN PATENT DOCUMENTS

| JP | 6-214792 A | 8/1994 |
| JP | 2878143 B2 | 1/1999 |
| JP | 2989156 B2 | 10/1999 |
| JP | 2001-246080 A | 9/2001 |
| KR | 2001-75069 A | 8/2001 |
| WO | WO 0106318 | 1/2001 |

OTHER PUBLICATIONS

Monthly Semiconductor World 1990. 12, Applied Physics vol. 60, Nov. (1991).

* cited by examiner

*Primary Examiner*—Geraldine Letscher
(74) *Attorney, Agent, or Firm*—Sughrue Mion, PLLC

(57) ABSTRACT

A method of manufacturing a photomask blank having at least a film for forming a mask pattern on a transparent substrate comprises the steps of causing a sputtering atmosphere to contain at least a helium gas to form a film for forming the mask pattern by sputtering, and heating the transparent substrate during or after the film forming step.

6 Claims, 3 Drawing Sheets

LIGHT AMPLITUDE DISTRIBUTION OF MASK

LIGHT INTENSITY DISTRIBUTION ON TRANSFERRED MEMBER

US 7,026,077 B2

PHOTOMASK BLANK MANUFACTURING METHOD

BACKGROUND OF THE INVENTION

1. Field of the Invention

The present invention relates to a photomask blank for manufacturing a lithography mask such as a photomask to be used in a lithographic process in the manufacture of a semiconductor device, and more particularly to a halftone type phase shift mask blank which is particularly suitable for a KrF excimer laser, an ArF excimer laser and an $F_2$ excimer laser and a method of manufacturing the halftone type phase shift mask blank.

2. Description of the Related Art

In recent years, it has been apparent that an increase in a resolution and the maintenance of a focal depth which are two important characteristics required for a photolithography are contrary to each other and a practical resolution cannot be enhanced by an increase in the NA of the lens of an exposing apparatus and a reduction in a wavelength (Monthly Semiconductor World 1990. 12, Applied Physics Vol. 60, November (1991)).

Under such circumstances, attention has been paid to a phase shift lithography as a photolithographic technique in a next generation and a part thereof has been used practically. The phase shift lithography is a method of enhancing the resolution of an optical lithography by changing only a mask without a variation in an optical system, and serves to give a phase difference between exposed lights transmitted through a photomask, thereby rapidly enhancing a resolution by utilizing a mutual interference of the transmitted lights.

The phase shift mask uses light intensity information and phase information together and various types such as a Levenson type, an auxiliary pattern type and a self-alignment type (an edge enhancement type) have been known. These phase shift masks have more complicated structures and require a more advanced technique for manufacture as compared with a conventional photomask having only the light intensity information.

As one of the phase shift masks, recently, a phase shift mask referred to as a so-called halftone type phase shift mask has been used practically.

Since the halftone type phase shift mask has both a shielding function of substantially shielding an exposed light by a light semitransmitting section and a phase shift function of shifting (usually inverting) the phase of a light, it has a feature that a shielding film pattern and a phase shift film pattern do not need to be formed separately, and a structure is simplified and manufacture can also be carried out easily.

In the halftone phase shift mask, a mask pattern is processed at a dry etching step. In a method of implementing the shielding function and the phase shift function by separate layers, it is necessary to carry out advanced control for obtaining an excellent pattern shape for both the layer having the shielding function and the layer having the phase shift function. On the other hand, it is possible to use the single etching step by constituting the single-layered light semitransmitting section having both the shielding function and the phase shift function. Consequently, a process for manufacturing a mask can be simplified and an excellent pattern shape can easily be obtained.

As shown in FIG. 1, the halftone type phase shift mask constitutes a mask pattern to be formed on a transparent substrate 100 by a light transmitting section (a transparent substrate exposing section) 200 for transmitting a light having such an intensity as to substantially contribute to exposure and a light semitransmitting section (a shielding section and phase shifter section) 300 for transmitting a light having such an intensity as not to substantially contribute to the exposure (FIG. 1(a)), the phase of the light transmitted through the light semitransmitting section 300 is shifted to have such a relationship that the phase of the light transmitted through the light semitransmitting section 300 is substantially inverted from the phase of the light transmitted through the light transmitting section 200 (FIG. 1(b)), and lights transmitted through the vicinity of the boundary part of the light semitransmitting section 300 and the light transmitting section 200 and going around the other mutual regions by a diffraction phenomenon are set to be cancelled from each other and a light intensity in the boundary part is set to be almost zero, thereby enhancing a contrast, that is, a resolution in the boundary part (FIG. 1(c)).

Moreover, a light semitransmitting section and a light semitransmitting film (a phase shift layer) in the halftone type phase shift mask or blank are to have a sufficient durability to a pretreatment such as washing in a mask manufacturing process and washing in the use of the mask or an acid solution such as sulfuric acid to be used as a washing liquid and a sufficient durability to an alkaline solution such as ammonium.

Referring to a phase shift mask capable of implementing these desired optimum characteristics by a single-layered light semitransmitting section, a proposal for a molybdenum silicide oxide nitride film (JP-A-6-214792 and Japanese Patents Nos. 2878143 and 2989156) has been made.

When the wavelength of a laser to be used for exposure is reduced from i rays (365 nm) or a KrF excimer laser (248 nm) to an ArF excimer laser (193 nm), the deviation of a phase angle with respect to an amount of a change in the thickness of a film is increased. Consequently, it is necessary to enhance a durability to the acid solution and the alkaline solution of the phase shift mask according to the reduction in the wavelength of the exposure.

When the wavelength of the laser to be used for the exposure is reduced, moreover, the energy of a laser beam is increased. Consequently, there is a problem in that the damage of the light semitransmitting section caused by the exposure is increased and a transmittance and a phase difference which are set are deviated for a period of the lifetime of use which is required for the phase shift mask.

On the other hand, the wavelength of an exposing light source to be used for a lithography has been reduced and the NA of the lens of an exposing apparatus has been increased with the microfabrication of a semiconductor circuit. However, the increase in the NA of the lens of the exposing apparatus and the maintenance of a focal depth are contrary to each other. In order to maintain the focal depth, a flatness has been required for a photomask more strictly. In recent years, a flatness of 0.3 to 0.5 µm has been required. The flatness of the photomask depends on the bending strength of a transparent substrate, the flatness of the substrate which is obtained before the formation of a film, and the internal stress of a film for forming a circuit pattern. In particular, the internal stress of the film for forming the circuit pattern has become a serious problem.

Under such circumstances, in the application (Japanese Patent Application No. 2001-246080) filed by the applicant, the density of a light semitransmitting section is increased in order to enhance an acid resistance, an alkali resistance and an excimer laser irradiation resistance of the phase shift mask. This application has disclosed a method of dropping a pressure in an atmosphere including argon and a reactive gas to be used for forming a film constituting the light semitransmitting section by sputtering in order to increase the density of the light semitransmitting section.

Furthermore, the application has disclosed a method of relieving the compressive stress of a light semitransmitting film by carrying out a heat treatment after the formation of the light semitransmitting film based on the fact that the internal stress of the film is increased with a reduction in the pressure in the atmosphere for the execution of the sputtering.

On the other hand, in the application, a heat treatment is to be carried out at a very high temperature (for example, 600° C.) in order to obtain a predetermined stress in some cases. Furthermore, there has been required a method capable of efficiently relieving a compressive stress by the heat treatment.

SUMMARY OF THE INVENTION

In consideration of the problems described above, it is an object of the invention to provide a method capable of effectively reducing the stress of a thin film for forming a pattern.

The invention has the following structures.

(Structure 1) A method of manufacturing a photomask blank having at least a film for forming a mask pattern on a transparent substrate, comprising the steps of:
  causing a sputtering atmosphere to contain at least a helium gas to form at least one layer of the film for forming the mask pattern by sputtering; and
  heating the transparent substrate during or after the film forming step.

(Structure 2) The method of manufacturing a photomask blank according to the structure 1, wherein the film for forming the mask pattern is provided by sputtering using a mixed gas containing argon and helium as a sputtering gas at the film forming step.

(Structure 3) The method of manufacturing a photomask blank according to the structure 1 or 2, wherein the photomask blank is a halftone type phase shift mask blank, and the film for forming the mask pattern is a light semitransmitting film constituted by at least one layer which has a predetermined transmittance for an exposed light and shifts a phase of the exposed light with respect to the transparent substrate in a predetermined amount.

(Structure 4) The method of manufacturing a photomask blank according to any of the structures 1 to 3, wherein the light semitransmitting film includes a film formed by a material containing silicon and nitrogen and/or oxygen, or a metal, silicon and nitrogen and/or oxygen.

(Structure 5) The method of manufacturing a photomask blank according to any of the structures 1 to 4, wherein a heat treating temperature at the step of heating the transparent substrate is 180° C. or more.

(Structure 6) A photomask manufactured by using the photomask blank according to any of the structures 1 to 5.

The invention will be described below in detail.

The invention provides a method of manufacturing a photomask blank having at least a film for forming a mask pattern on a transparent substrate, comprising the steps of:
  causing a sputtering atmosphere to contain at least a helium gas to form at least one layer of the film for forming the mask pattern by sputtering; and
  heating the transparent substrate during or after the film forming step (structure 1).

Based on the experiment of the inventors, the invention was achieved by partially or wholly replacing argon with helium to more reduce a compressive stress than that in the case in which the argon has conventionally been used as a sputtering gas. Moreover, it was found that a pressure stress can be reduced more effectively by the execution of a heat treatment during or after the formation of a film. The reason is guessed as follows. Helium which is easily volatilized is caused to be previously present in a film and the helium is volatilized by the heat treatment so that the compressive stress in the film tends to be relieved.

In the invention, a sputtering pressure is preferably 0.20 to 0.40 Pa, more preferably 0.23 to 0.35 Pa and most preferably 0.25 to 0.31 Pa. If a pressure in the sputtering atmosphere is low as in the range described above, the density of a light semitransmitting film can be increased to cause the same film to be minute. By causing the thin film to be minute, a chemical resistance to acid or alkali, a light resistance and an excimer laser irradiation resistance can be enhanced, and furthermore, pattern precision in a fine pattern can also be improved. When the pressure is less than that within the range, there is a possibility that the internal stress of the film might be so increased as not to be improved by the heat treatment and the stability of the formation of the film might be influenced.

In the invention, in the case in which the film for forming the mask pattern includes a film having the property of a compressive stress of at least one layer, the compressive stress of the film having the property of the compressive stress can be reduced. The property of the compressive stress implies that a stress applied when only Ar is used as a sputter gas is set to be the compressive stress.

In the case in which a film having the property of the compressive stress for forming the mask pattern on a transparent substrate has a multilayer structure as will be described below, it is preferable that at least one layer should be subjected to sputtering within the range of a sputtering pressure and it is more preferable that all the films should be subjected to the sputtering within the range of the sputtering pressure.

In the invention, the preferable sputtering gas in the sputtering atmosphere is a mixed gas containing an inert gas such as argon and helium. It is possible to use another inert gas in place of argon and to add another inert gas to the mixed gas containing argon and helium.

In the case in which a reactive gas such as nitrogen or oxygen is added into the sputtering atmosphere to carry out reactive sputtering, a preferable content of a sputtering gas is 25 to 34% for He. If the content is less than a lower limit, the effect of reducing a stress is lessened. If the content is more than an upper limit, a sputter rate is reduced so that a productivity is deteriorated. The content of Ar is 5 to 15%. If the content is less than a lower limit, an optical characteristic becomes extremely unstable. If the content is more than an upper limit, the sputter rate is reduced so that the productivity is deteriorated.

In the invention, examples of the film for forming the mask pattern on the transparent substrate include a light semitransmitting film in a halftone type phase shift mask and a shielding film in a photomask.

The light semitransmitting film in the halftone type phase shift mask includes a light semitransmitting film having a single layer structure and a light semitransmitting film having a multilayer structure designed in such a manner that a layer having a low transmittance and a layer having a high transmittance are provided in at least two layers and a phase angle and a transmittance have desirable values.

Examples of the light semitransmitting film having a single layer structure include a material containing oxygen and/or nitrogen in a metal and silicon, a material containing carbon and/or fluorine and/or hydrogen therein, chromium oxide and chromium fluoride, and it is preferable that the light semitransmitting film should be substantially formed of a metal, silicon and nitrogen and/or oxygen. The metal is at least one selected from titanium, vanadium, niobium, molybdenum, tantalum and tungsten. The metal to be usually used often is molybdenum. Molybdenum is particularly excellent in the controllability of a transmittance and a target density in the metals. Titanium, vanadium and niobium are excellent in a durability to an alkali solution and have target densities which are slightly less than the target density of molybdenum. Tantalum is excellent in the durability to the alkali solution and the target density and has the controllability of a transmittance which is slightly less than that of molybdenum. Tungsten has a similar property to molybdenum and has a discharge characteristic in sputtering which is slightly less than that of molybdenum.

For the light semitransmitting film having a multilayer structure, it is preferable to use a layer having a high transmittance which is substantially formed of silicon and nitrogen and/or oxygen or a layer having a high transmittance which is substantially formed of a metal (which is the same as the metal in the light semitransmitting film having a single layer structure), silicon and nitrogen and/or oxygen, and to use, for a layer having a low transmittance, a metallic film formed of at least one alloy comprising chromium, molybdenum, tantalum, titanium, tungsten, hafnium and zirconium, or oxides, nitrides, acid nitrides and suicides of these metals or alloys.

Examples of the shielding film in a photomask include a shielding film having a single layer or multilayer structure formed of chromium or a chromium compound containing oxygen, nitrogen or carbon in chromium or another chromium compound.

In the invention, in the case in which the film for forming the mask pattern on the transparent substrate has the multilayer structure, it is preferable that at least a film having the property of the compressive stress should contain at least a helium gas in the sputtering atmosphere to carry out sputtering film formation. A film formed by a material containing silicon and nitrogen and/or oxygen, or a metal, silicon and/or nitrogen or oxygen usually has the property of the compressive stress.

In the invention, the temperature of the heat treatment at the step of heating the transparent substrate during or after the film forming step is preferably 180° C. or more and more preferably 200° C. or more, 300° C. or more and 400° C. or more in order to effectively volatilize helium in the film and to advantageously relieve the compressive stress in the film. When the temperature is raised to be high, a long heat arrival time in a heat treating apparatus is taken and the apparatus is managed with more difficulty. Consequently, a temperature of 500° C. or less is practically preferable.

As an atmosphere for the heat treatment, it is possible to use an atmosphere or an inert gas such as nitrogen or argon. In a gas containing oxygen such as an atmosphere, the characteristic of a light semitransmitting film is slightly changed by the heat treatment in some cases. For this reason, it is preferable that the light semitransmitting film should be formed in consideration of the change during the film formation. In the case in which the characteristic of the film is to be prevented from being changed by the heat treatment, it is preferable that the heat treatment should be carried out in an inert gas atmosphere. In case of a heat treatment having a high temperature (for example, 380° C. or more), particularly, the amount of a change in the characteristic of a film is also large. For this reason, it is desirable that the heat treatment should be carried out in the inert gas atmosphere.

DESCRIPTION OF THE PREFERRED EMBODIMENTS

Embodiments of the invention will be described below in detail.

(First Embodiment)

In the embodiment, description will be given to an advantage obtained by using helium as a sputtering gas and the effect of a heat treatment to be carried out after the formation of a film.

Figure 1A:
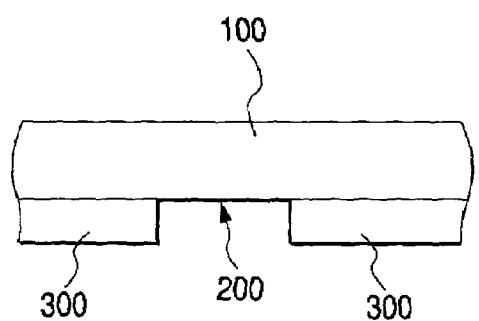
FIGS. 1A, 1B and 1C are diagrams for explaining the transfer principle of a halftone type phase shift mask.
Figure 1B:
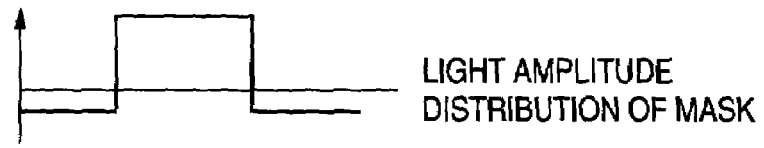
Figure 1C:
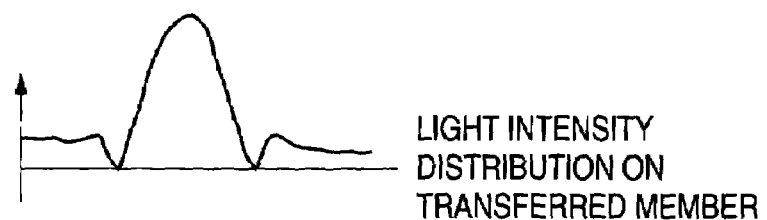
Figure 2:
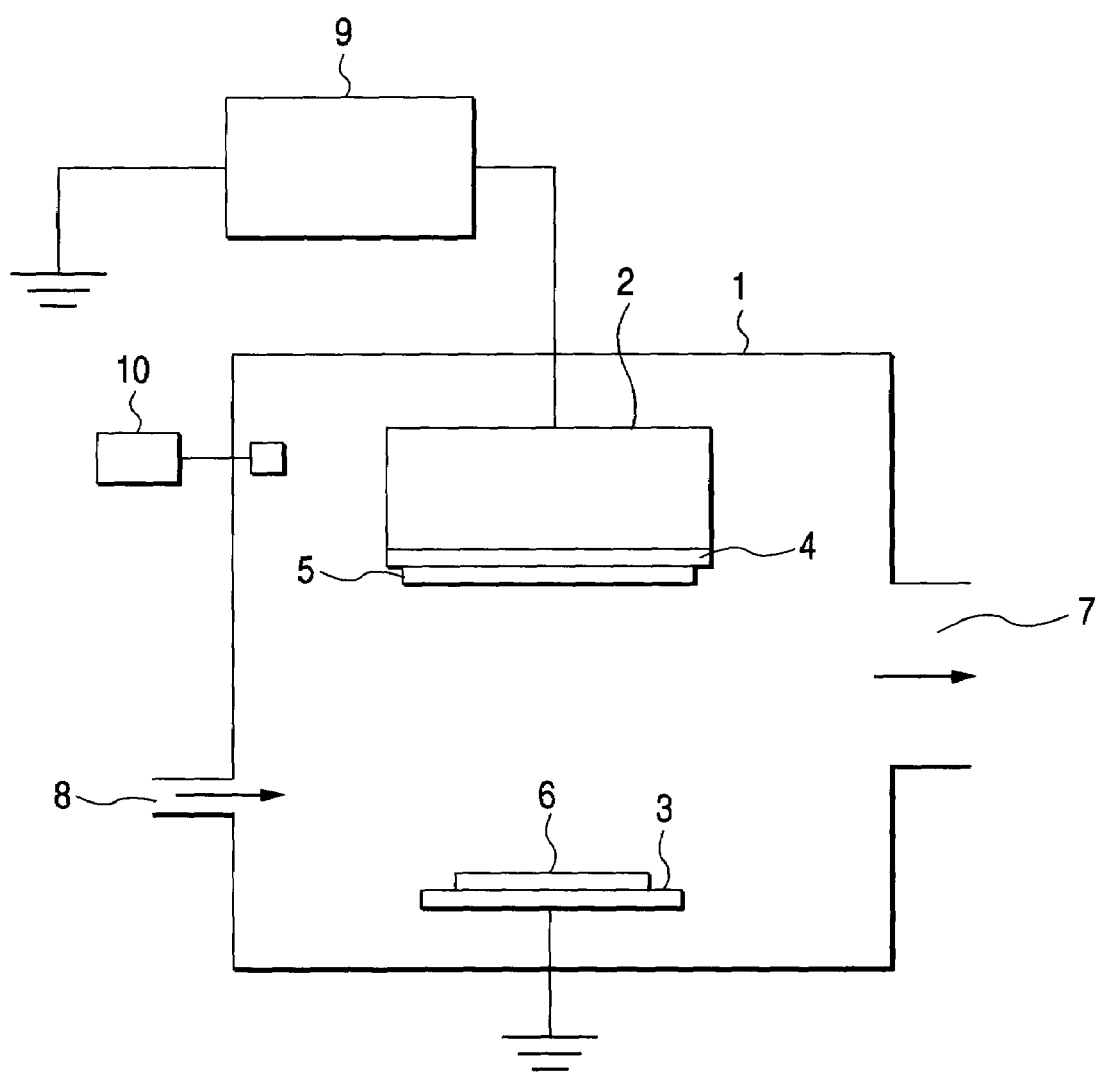
FIG. 2 is a typical diagram showing a DC magnetron sputtering apparatus used in the embodiments.

By using a DC magnetron sputtering apparatus shown in FIG. 2, a light semitransmitting film having a single layer which is substantially formed of molybdenum, silicon and nitrogen was formed on a transparent substrate and a halftone type phase shift mask blank was thus fabricated.

The DC magnetron sputtering apparatus has a vacuum tank 1 and a magnetron cathode 2 and a substrate holder 3 are provided in the vacuum tank 1. A sputtering target 5 bonded to a backing plate 4 is attached to the magnetron cathode 2. The backing plate 4 is directly or indirectly cooled by a water cooling mechanism. The magnetron cathode 2 is electrically coupled to the backing plate 4 and the sputtering target 5. A transparent substrate 6 is attached to the substrate holder 3.

A gas is exhausted from the vacuum tank 1 through an exhaust port 7 by means of a vacuum pump. After an atmosphere in the vacuum tank 1 reaches such a degree of vacuum as not to influence the characteristic of a film to be formed, a mixed gas containing nitrogen is introduced from a gas inlet 8 and a negative voltage is applied to the magnetron cathode 2 by using a DC power source 9, thereby carrying out sputtering. A pressure in the vacuum tank 1 is measured by a pressure gauge 10.

By using a molybdenum silicide target (Mo:Si=20:80), a mixed gas containing Ar, $N_2$ and He to be a sputtering gas was introduced in amounts of Ar: 10 sccm, $N_2$: 80 sccm and He: 0.9, 18, 36, 54 and 69 sccm to form a light semitransmitting film (a phase angle of 182 to 184 degrees and a transmittance of 5 to 6%) on a phase shift mask blank. After the formation of the film, the phase shift mask blank was not subjected to a heat treatment and was subjected to the heat treatment at 200° C. and then 400° C. Thus, the internal stress of the light semitransmitting film was evaluated. The internal stress of the light semitransmitting film was evaluated by measuring an amount of a change in the flatness of a transparent substrate before and after the formation of the light semitransmitting film.

The flatness was measured within a range of 146 mm square excluding an end of 3 mm of a synthetic quartz substrate (152 mm×152 mm×6.35 mm), and was defined by a difference in a height between a maximum point and a minimum point from the average surface of the substrate.

The flatness of the transparent substrate was measured by using an interferometer (FlatMaster 200 manufactured by TROPEL Co., Ltd.).

Figure 3:
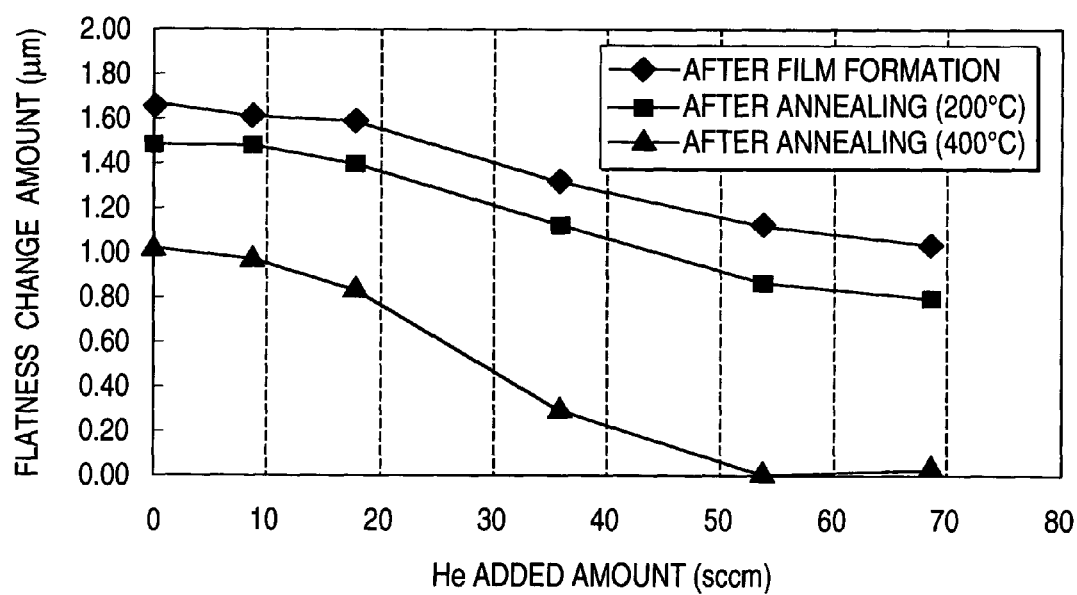
FIG. 3 is a chart showing the relationship between an amount of introduction of He and an amount of a change in a flatness.

FIG. 3 shows the relationship between the amount of introduction of He of the sputtering gas and an amount of a change in a flatness for each of the blanks which were not subjected to the heat treatment after the formation of the film and were subjected to the heat treatment at 200° C. and then 400° C. The amount of a change in a flatness in FIG. 3 indicates a positive amount of a change, that is, a compressive stress.

As is apparent from FIG. 3, He is introduced into a sputtering gas so that the amount of a change in a flatness tends to be reduced, and the heat treatment is further carried out so that the amount of a change in a flatness can be more reduced. Thus, it is shown that the compressive stress of a light semitransmitting film can be reduced.

(Second Embodiment)

In the embodiment, description will be given to an example in which a halftone type phase shift mask blank for a KrF excimer laser (248 nm) having a single-layered light semitransmitting film which is substantially formed of molybdenum, silicon and nitrogen was manufactured.

By using the same sputtering apparatus as that in the first embodiment, Mo:Si=20:80 was used as a sputtering target and argon, nitrogen and helium were used for a sputtering gas (a gas flow rate: Ar=10 sccm, $N_2$=80 sccm and He=40 sccm) to carry out regulation in such a manner that the phase angle of a light semitransmitting film is approximately 180 degrees with a film forming pressure of 0.28 Pa. Thus, the light semitransmitting film was formed. In that case, a flatness was 1.3 μm.

Then, a heat treatment was carried out for 30 minutes at 250° C. by using a heat treating apparatus.

The halftone type phase shift mask blank thus obtained had a transmittance for an exposed light of 6%, a phase angle of approximately 180 degrees, and a flatness of 0.6 μm, which satisfied desired values.

Moreover, all of a chemical resistance (an acid resistance, an alkali resistance and a functional water resistance), and a light resistance (a KrF excimer laser resistance) almost satisfied desired values.

(Third Embodiment)

In the embodiment, description will be given to an example in which a halftone type phase shift mask blank for an ArF excimer laser (193 nm) having a single-layered light semitransmitting film which is substantially formed of molybdenum, silicon and nitrogen was manufactured.

By utilizing the same sputtering apparatus as that in the first embodiment, Mo:Si=10:90 was used as a sputtering target and argon, nitrogen and helium were used for a sputtering gas (a gas flow rate: Ar=10 sccm, $N_2$=80 sccm and He=40 sccm) to carry out regulation in such a manner that the phase angle of a light semitransmitting film is approximately 180 degrees with a film forming pressure of 0.25 Pa. Thus, the light semitransmitting film was formed. In that case, a flatness was 1.3 μm.

Then, a heat treatment was carried out for 30 minutes at 250° C. by using a heat treating apparatus.

The halftone type phase shift mask blank thus obtained had a transmittance for an exposed light of 6%, a phase angle of approximately 180 degrees, and a flatness of 0.6 μm, which satisfied desired values.

Moreover, all of a chemical resistance (an acid resistance, an alkali resistance and a functional water resistance), and a light resistance (an ArF excimer laser resistance) almost satisfied desired values.

(Fourth Embodiment)

A resist film (a baking temperature: 190° C. for ArF and 180° C. for Krf) was formed on the light semitransmitting film of the phase shift mask blank according to each of the second and third embodiments and a resist pattern was formed by pattern exposure and development. Next, an exposed portion was removed by etching (dry etching using a $CF_4+O_2$ gas), and the pattern (a hole or a dot) of the light semitransmitting film, that is, a light semitransmitting section was obtained. After the resist was removed, the light semitransmitting section was immersed in 98% sulfuric acid ($H_2SO_4$) at 100° C. for 15 minutes and was washed with the sulfuric acid, and was then rinsed with pure water. Thus, a phase shift mask for an ArF excimer laser and a phase shift mask for a KrF excimer laser were obtained.

While the invention has been described by taking the preferred embodiments as examples, the invention is not restricted to the embodiments.

For example, the invention can be applied to a halftone type phase shift mask or blank including a light semitransmitting film having a multilayer structure or a photomask or photomask blank having a single-layered or multilayered shielding film in addition to a halftone type phase shift mask or blank having a single-layered light semitransmitting film.

The invention can also be applied to a halftone type phase shift mask or blank for an $F_2$ excimer laser (157 nm) including a light semitransmitting section or light semitransmitting film having a single layer. Furthermore, the invention can also be applied when using an oxygen gas as a reactive gas for sputtering to form a light semitransmitting section or light semitransmitting film having a single layer or multilayer structure including a film containing silicon such as MoSiO, MoSiON, NiSiON, PdSiON, SiON or SiO and oxygen, for example.

[ADVANTAGE OF THE INVENTION]

As described above, according to the invention, a sputtering atmosphere is caused to contain at least a helium gas to form a film by sputtering and a transparent substrate (a thin film formed by the sputtering) is heated during or after the film formation. Thus, it is possible to efficiently reduce the stress of the film.

What is claimed is:

1. A method of manufacturing a photomask blank having at least a film for forming a mask pattern on a transparent substrate, comprising the steps of:
   causing a sputtering atmosphere to contain at least a helium gas to form at least one layer of the film for forming the mask pattern by sputtering; and
   heating the transparent substrate during or after the film forming step,
   wherein a heat treating temperature at the step of heating the transparent substrate is 180° C. or more.

2. The method of manufacturing a photomask blank according to claim 1, wherein the film for forming the mask pattern is provided by sputtering using a mixed gas containing argon and helium as a sputtering gas at the film forming step.

3. The method of manufacturing a photomask blank according to claim 1 or 2, wherein the photomask blank is a halftone type phase shift mask blank, and the film for forming the mask pattern is a light semitransmitting film constituted by at least one layer which has a predetermined transmittance for an exposed light and shifts a phase of the exposed light with respect to the transparent substrate in a predetermined amount.

4. The method of manufacturing a photomask blank according to claim 3, wherein the light semitransmitting film includes a film formed by a material containing silicon and nitrogen and/or oxygen, or a metal, silicon and nitrogen and/or oxygen.

5. A photomask manufactured by using the photomask blank manufacturing method according to claim 1.

6. A photomask manufactured by using the photomask blank manufacturing method according to claim 3.

* * * * *